United States Patent
Fischer

(10) Patent No.: US 7,578,258 B2
(45) Date of Patent: Aug. 25, 2009

(54) METHODS AND APPARATUS FOR SELECTIVE PRE-COATING OF A PLASMA PROCESSING CHAMBER

(75) Inventor: Andreas Fischer, Castro Valley, CA (US)

(73) Assignee: Lam Research Corporation, Fremont, CA (US)

(*) Notice: Subject to any disclaimer, the term of this patent is extended or adjusted under 35 U.S.C. 154(b) by 392 days.

(21) Appl. No.: 11/367,290

(22) Filed: Mar. 3, 2006

(65) Prior Publication Data

US 2007/0204797 A1    Sep. 6, 2007

(51) Int. Cl.
*C23C 16/00* (2006.01)
(52) U.S. Cl. .................. 118/723 R; 118/723 E; 118/723 I
(58) Field of Classification Search ............... 118/723 R
See application file for complete search history.

(56) References Cited

U.S. PATENT DOCUMENTS

| | | | |
|---|---|---|---|
| 6,506,685 B2 | 1/2003 | Li et al. | |
| 6,776,851 B1 | 8/2004 | Singh et al. | |
| 6,823,815 B2* | 11/2004 | Han et al. | 118/723 E |
| 6,900,596 B2 | 5/2005 | Yang et al. | |
| 6,994,769 B2 | 2/2006 | Singh et al. | |
| 7,122,125 B2 | 10/2006 | Deshmukh et al. | |
| 7,204,913 B1 | 4/2007 | Singh et al. | |
| 2003/0047449 A1* | 3/2003 | Hanawa et al. | 204/298.06 |
| 2003/0151371 A1 | 8/2003 | Fischer et al. | |
| 2004/0127067 A1 | 7/2004 | Dunham | |
| 2005/0103444 A1* | 5/2005 | Brcka | 156/345.48 |
| 2006/0011138 A1* | 1/2006 | Kang et al. | 118/723 R |
| 2006/0043067 A1 | 3/2006 | Kadkhodayan et al. | |

OTHER PUBLICATIONS

"International Search Report", Issued in PCT Application No. PCT/US2007/063102; Mailing Date: Jul. 18, 2008.
"Written Opinion", Issued in PCT Application No. PCT/US2007/063102; Mailing Date: Jul. 18, 2008.
"International Preliminary Report on Patentability", Issued in PCT Application No. PCT/US2007/063102; Mailing Date: Sep. 18, 2008.

* cited by examiner

*Primary Examiner*—Michael Cleveland
*Assistant Examiner*—Keath T Chen
(74) *Attorney, Agent, or Firm*—IP Strategy Group, P.C.

(57) ABSTRACT

An apparatus for selectively pre-coating a plasma processing chamber, including a chamber wall is disclosed. The apparatus includes a first set of RF electrodes, the first set of RF electrodes configured to strike a first pre-coat plasma, the first set of RF electrodes defining a first plasma chamber zone. The apparatus also includes a first set of confinement rings disposed around the first set of RF electrodes; and a second set of confinement rings disposed between the first set of confinement rings and the chamber wall. The apparatus further includes a gas delivery system configured to apply a first pre-coat layer to the first plasma zone when a first pre-coat gas is delivered and the first set of RF electrodes is energized. The apparatus also includes the gas delivery system configured to apply a second pre-coat layer to the second plasma zone when a second pre-coat gas is delivered and the second set of RF electrodes is energized.

15 Claims, 5 Drawing Sheets

US 7,578,258 B2

METHODS AND APPARATUS FOR SELECTIVE PRE-COATING OF A PLASMA PROCESSING CHAMBER

BACKGROUND OF THE INVENTION

The present invention relates in general to substrate manufacturing technologies and in particular to methods and apparatus for selective pre-coating of a plasma processing chamber.

In the processing of a substrate, e.g., a semiconductor substrate or a glass panel such as one used in flat panel display manufacturing, plasma is often employed. As part of the processing of a substrate in a plasma chamber for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In order to optimize the plasma process, many surfaces within the plasma chamber are further configured with plasma resistant materials (e.g., silicon, silicon carbide, silicon nitride, quartz, etc.) that help to minimize surface wear without substantially increasing contaminants that may, in turn, affect the substrate. However, continued exposure to the plasma sheath tends to etch away and eventually remove the protective material, often resulting in surface particle contamination and hence lower substrate yields.

Generally, the plasma sheath tends to accelerate charged particles (e.g., ions, etc.) from the plasma edge to strike surfaces in the plasma chamber. Eventually, the processing chamber surfaces may erode and thus need to be replaced in order to assure long-term stability to the plasma process. Consequently, substantial operational costs and downtime may be added to the substrate manufacturing process, depending on the chemistry, the process pressure, and the amount of power to be used to generate said plasma.

In view of the foregoing, there are desired methods and apparatus for selective pre-coating of a plasma processing chamber.

SUMMARY OF THE INVENTION

The invention relates, in one embodiment, to an apparatus for selectively pre-coating a plasma processing chamber, including a chamber wall. The apparatus includes a first set of RF electrodes, the first set of RF electrodes configured to strike a first pre-coat plasma, the first set of RF electrodes defining a first plasma chamber zone. The apparatus also includes a first set of confinement rings disposed around the first set of RF electrodes; and a second set of confinement rings disposed between the first set of confinement rings and the chamber wall. The apparatus further includes a gas delivery system configured to apply a first pre-coat layer to the first plasma zone when a first pre-coat gas is delivered and the first set of RF electrodes is energized.

The invention relates, in one embodiment, to an apparatus for selectively pre-coating a plasma processing chamber, including a chamber wall. The apparatus includes a first set of RF electrodes, the first set of RF electrodes configured to strike a first pre-coat plasma, the first set of RF electrodes defining a first plasma chamber zone. The apparatus also includes a second set of RF electrodes, the second set of RF electrodes configured to strike a second pre-coat plasma, the second set of RF electrodes defining a second plasma chamber zone. The apparatus further includes a first set of confinement rings disposed between the first set of RF electrodes and the second set of RF electrodes; and a second set of confinement rings disposed between the second set of RF electrodes and the chamber wall. The apparatus also includes a gas delivery system configured to pre-coat the first plasma zone when the first pre-coat gas is delivered and the first set of RF electrodes is energized, the gas delivery system further configured to pre-coat the second plasma zone when the second pre-coat gas is delivered and the second set of RF electrodes is energized.

The invention relates, in one embodiment, to a method for selectively pre-coating a plasma processing chamber, including a chamber wall. The method includes configuring a first set of RF electrodes to strike a first pre-coat plasma, the first set of RF electrodes defining a first plasma chamber zone. The method also includes configuring a first set of confinement rings around the first set of RF electrodes; and configuring a second set of confinement rings between the first set of confinement rings and the chamber wall. The apparatus further includes configuring a gas delivery system to apply a first pre-coat layer to the first plasma zone when a first pre-coat gas is delivered and the first set of RF electrodes is energized.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
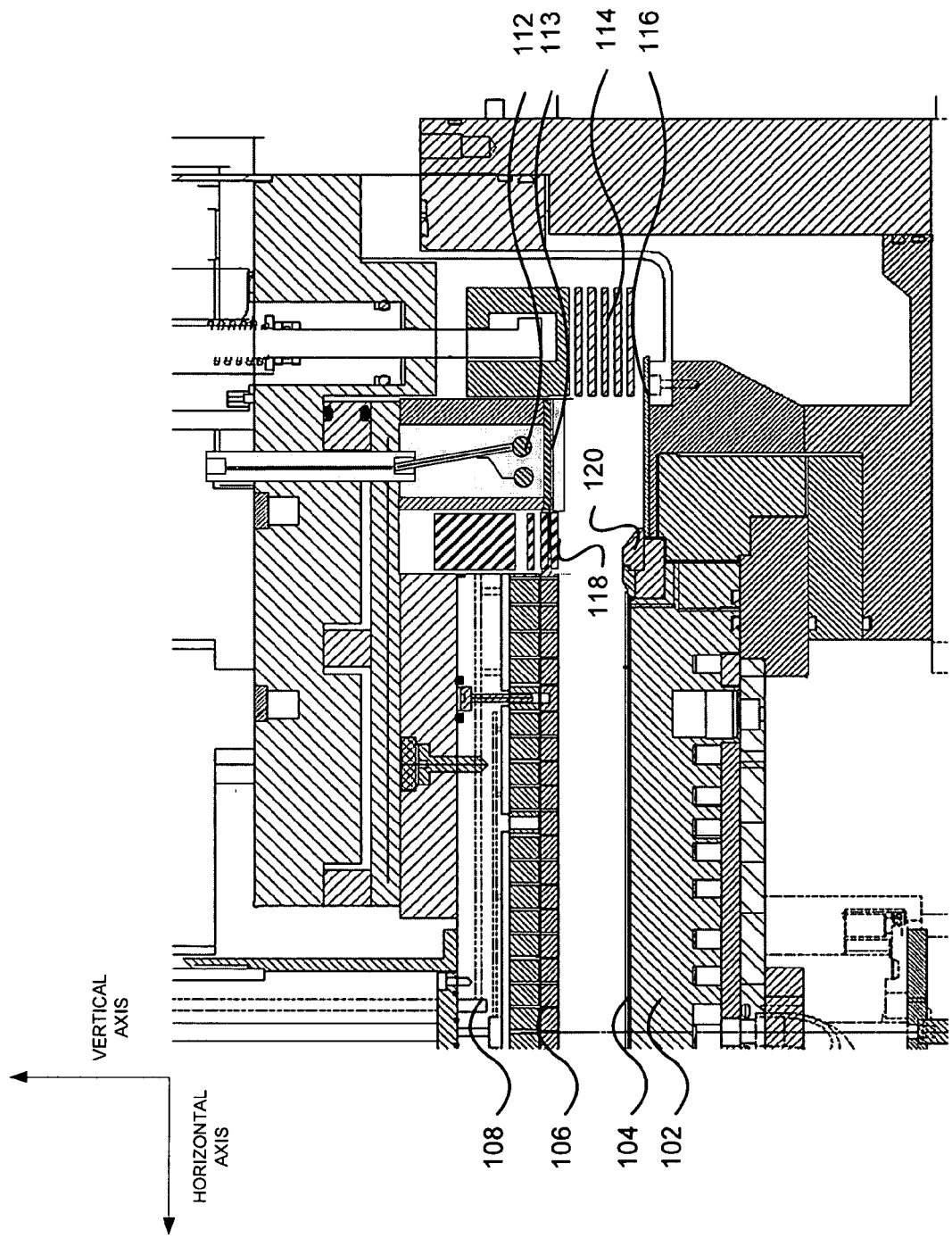
FIG. 1 shows a simplified diagram of a differential plasma processing chamber with a dual confinement ring set, according to an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. While not wishing to be bound by theory, it is believed by the inventors herein that plasma surface damage, as well as contamination within the plasma chamber, may be reduced by first substantially isolating, and then selectively pre-coating, a set of surfaces with an optimized pre-coat material. In general, optimum pre-coat materials include those that typically become volatile when exposed to a plasma (e.g., silicon, amorphous silicon, silicon nitride, silicon dioxide, silicon carbide, hydrocarbon gas, $C_4F_6$, $C_4F_8$, $CH_3F$, etc.)

In an embodiment, a pre-coat may be added between the plasma processing of successive substrates. In an embodiment, the thickness of a pre-deposited layer in each region or zone should be thick enough to withstand the subsequent etching of at least one substrate. In an embodiment, the thickness of a pre-deposited layer in each region or zone should be thick enough to withstand the subsequent etching of several substrates, such as when processing a substrate cassette. In an embodiment, multiple pre-deposited layers are deposited in each region or zone. In an embodiment, after completion of an etch cycle, all pre-coated layers may be removed in a dry clean step such that pre-coating may commence again.

For example, an upper grounded electrode of a capacitively coupled source may be already configured with a protective layer of silicon that shields the underlying grounded surface (e.g., single-crystal silicon or aluminum, etc.) from the plasma process. Consequently, pre-coating the grounded electrode with a material that is compatible with the silicon protective layer (e.g., silicon, amorphous silicon, silicon carbide, silicon nitride, etc.), prior to etching the substrate, would substantially reduce contamination as well as extend the operational life of the upper grounded electrode.

In another example, a lower grounded electrode of an inductively coupled source may be already configured with a protective cover of quartz that shields the underlying grounded surface (e.g., aluminum, etc.) from the plasma process. Consequently, pre-coating the quartz cover with a material that is compatible with quartz (e.g., hydrocarbons, etc.), prior to etching the substrate would substantially reduce contamination as well as extend the operational life of the quartz cover.

In an embodiment, the plasma chamber comprises a plurality of concentric confinement ring sets, each with a different diameter. By raising and lowering a particular confinement ring set, an appropriate pre-coat plasma may be isolated to a particular area of the plasma chamber.

In an embodiment, the plasma used to etch the substrate is a differential plasma. That is, a plasma that is sustained with a plurality of energy sources. For example, in a dielectric etch system, a capacitively coupled plasma source which principally controls ion energy, and an inductively coupled plasma source, which principally controls plasma density, may be combined in order to etch a substrate with substantial radial plasma uniformity and radial etch uniformity.

In general, the capacitively coupled plasma source may be configured with a set of electrode plates (e.g., powered electrode, grounded electrode, etc.) positioned above and below the center of the substrate. Typically, the powered electrode is configured also as an electrostatic chuck (chuck), upon which the substrate is placed during the plasma process. Likewise, the grounded electrode is typically configured as a showerhead.

An inductively coupled plasma source may be configured with a set of induction coils and a grounded ring positioned above and below the perimeter of the substrate. In an embodiment, an inner confinement ring set is positioned between the capacitively coupled plasma and the inductively coupled plasma source, and an outer confinement ring may be positioned between the inductively coupled plasma source and a plasma chamber wall.

Referring now to FIG. 1, a simplified diagram (of a partial cross-sectional view) of a differential plasma processing chamber with a dual confinement ring set is shown, according to an embodiment of the invention. In general, in order to sustain the differential plasma, a capacitively coupled plasma (CCP) source is configured to control ion energy, and an inductively coupled plasma (ICP) source is configured to control plasma density.

A typical CCP source configuration commonly consists of two metal electrodes separated by a small distance, and operates in a manner similar in principle to a capacitor in an electric circuit. A first powered electrode 102 is typically configured as a chuck. Additionally, a second grounded electrode 108 is typically configured as part of a showerhead assembly 106, which commonly also includes a protective layer of perforated silicon that allow plasma gases to pass through into the plasma chamber from a gas distribution system [not shown]. Furthermore, a substrate 104 is commonly positioned with edge ring 120 on chuck/powered electrode 102.

Likewise, a typical ICP source configuration commonly consists of a set of induction coils 112 and a grounded ring 116. The set of induction coils 112 is typically configured to radiate radio frequency energy into the plasma gas through a quartz window 113, which may provide a protective shield from a generated plasma [not shown]. Likewise, grounded ring 116 is also configured with a protective quartz layer, and is typically positioned below the perimeter of substrate 104. Quartz is essentially transparent to the generated RF waves. In addition, typically coupled to both the CCP source and the ICP source is a matching network [not shown] that attempts to match the impedances of each RF generator to that of the load which is, in part, formed by the plasma.

In addition, an inner confinement ring set 118 may be positioned between the CCP source and the ICP source, and may further be raised and lowered as required to isolate and/or channel the plasma to specific areas of the plasma chamber. For example, when inner confinement ring set 118 is positioned in an up position, and the CCP source and/or the ICP source is energizing a set of plasma gases, the resulting plasma may extend across substrate 104 toward outer confinement ring set 114.

In contrast, when inner confinement ring set 118 is positioned in a down position [not shown], and the CCP source is energizing a set of plasma gases, the plasma may be confined to the area defined by the diameter of the inner confinement ring set 118.

However, when inner and outer confinement ring sets 118 and 114 are positioned in a down position [not shown], and the ICP source is energizing a set of plasma gases, the plasma may be confined to the area (e.g., toroid, etc.) defined by both the inner confinement ring set 118 and the outer confinement ring set 114.

Alternatively, when inner and outer confinement ring sets 118 and 114 are positioned in a down position [not shown], and both the CCP and the ICP source are energizing a set of plasma gases, a first plasma maybe confined to the area defined by the diameter of the inner confinement ring set, and a second plasma may be confined to the area defined by both the inner confinement ring set 118 and the outer confinement ring set 114.

Typically, each confinement ring set is configured as a series of quartz rings positioned around a horizontal perimeter of a substrate, and further positioned in varying distances above the substrate along the vertical axis, commonly by the use of a cam ring. In general, the thickness of each confinement ring, as well as the size of the gap between any two rings, is configured in order to optimize the particular plasma process and control the pressure within the plasma. In some configurations, the confinement rings are of differing diameter and thickness. For example, a confinement ring positioned closer to a substrate along the vertical axis, may be smaller in diameter to one farther away from the substrate.

Figure 2:
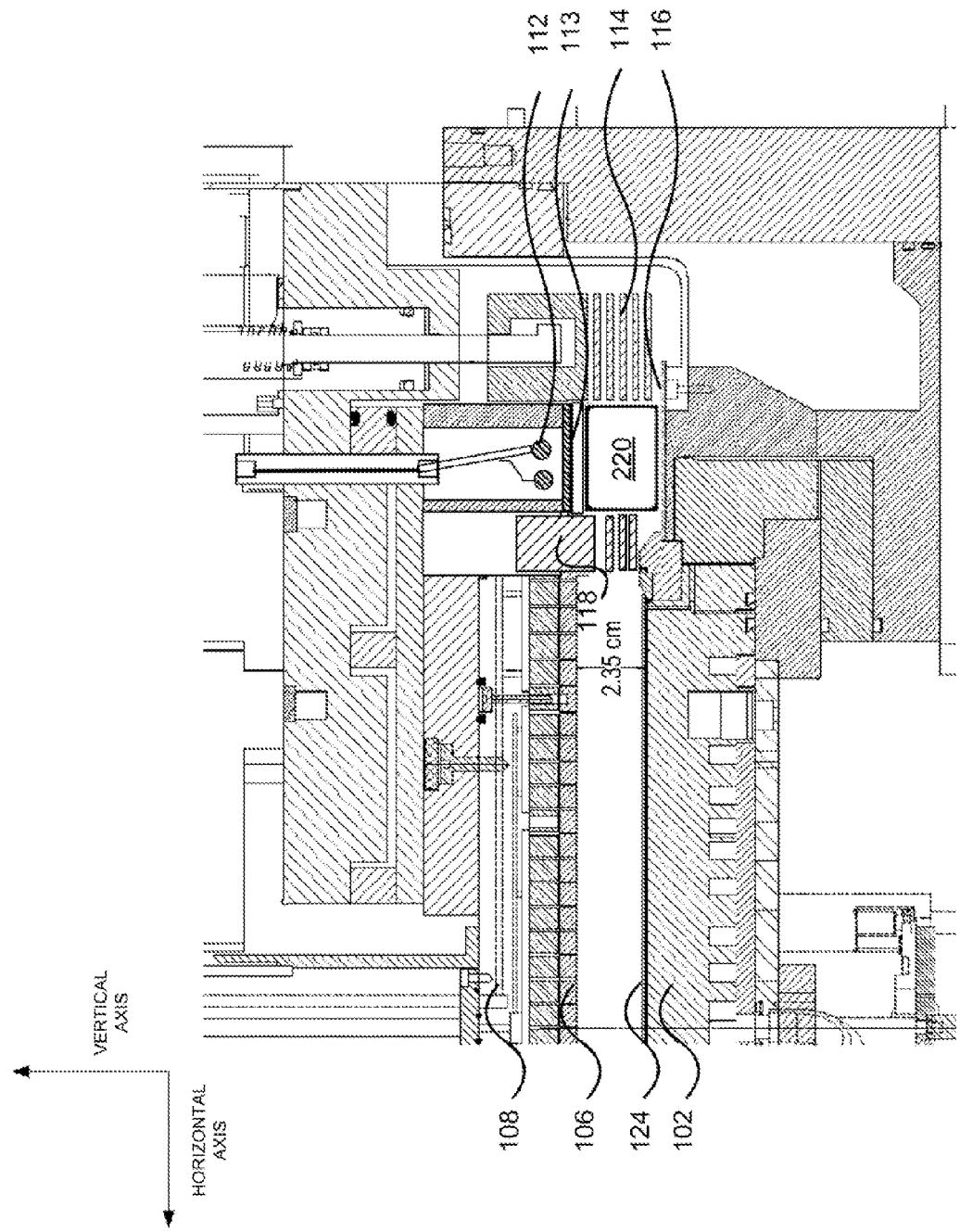
FIG. 2 shows the simplified diagram of a differential plasma processing chamber, in which an area underneath an ICP coil is pre-coated with a set of hydrocarbons, according to an embodiment of the invention.

Referring not to FIG. 2, the simplified diagram of a differential plasma processing chamber of FIG. 1 is shown, in which an area underneath an ICP coil is pre-coated with either a set of hydrocarbons or with silicon dioxide, according to an embodiment of the invention. As previously stated, both the set of induction coils 112 and grounded ring 116 are typically shielded from a plasma by a set of quartz surfaces. In an advantageous manner, prior to processing a substrate, a substantial portion of these quartz surfaces may be pre-coated with a hydrocarbon layer or with a silicon dioxide layer, such that the hydrocarbon layer or the pre-deposited silicon dioxide layer, and not the underlying quartz surface, may be etched during plasma processing. In an embodiment, the thickness of the hydrocarbon pre-coat or silicon dioxide layer is about 1.5 μm.

A hydrocarbon is generally a Teflon-like material that may be chemically described by $C_xH_yF_z$, where x is an integer greater than 0, and y and z are integers greater than or equal to zero (e.g, $C_4F_6$, $C_4F_8$, $CH_3F$, etc.). Quartz is silicon oxide and is chemically described as $SiO_2$. The Teflon-like or silicon dioxide pre-coat is physically bonded to the quartz surface via Van-der Waals forces; no chemical reaction between the coat and the quartz generally needs to occur.

In one method of pre-coating the quartz surfaces, both inner confinement ring set 118 and the outer confinement ring set 114 are lowered. A hydrocarbon gas is then fed into the differential plasma chamber through showerhead 106, and consequently seeps into a channel 220 defined by inner confinement ring set 118 and outer confinement ring set 114. In an embodiment, the hydrocarbon is a fluorinated hydrocarbon gas. The set of induction coils 112 may then energized, causing a hydrocarbon pre-coat to be deposited on the quartz surfaces. Typically, a covering or dummy substrate 124 is placed on powered electrode 102 in order to shield it during the pre-coat process.

Figure 3:
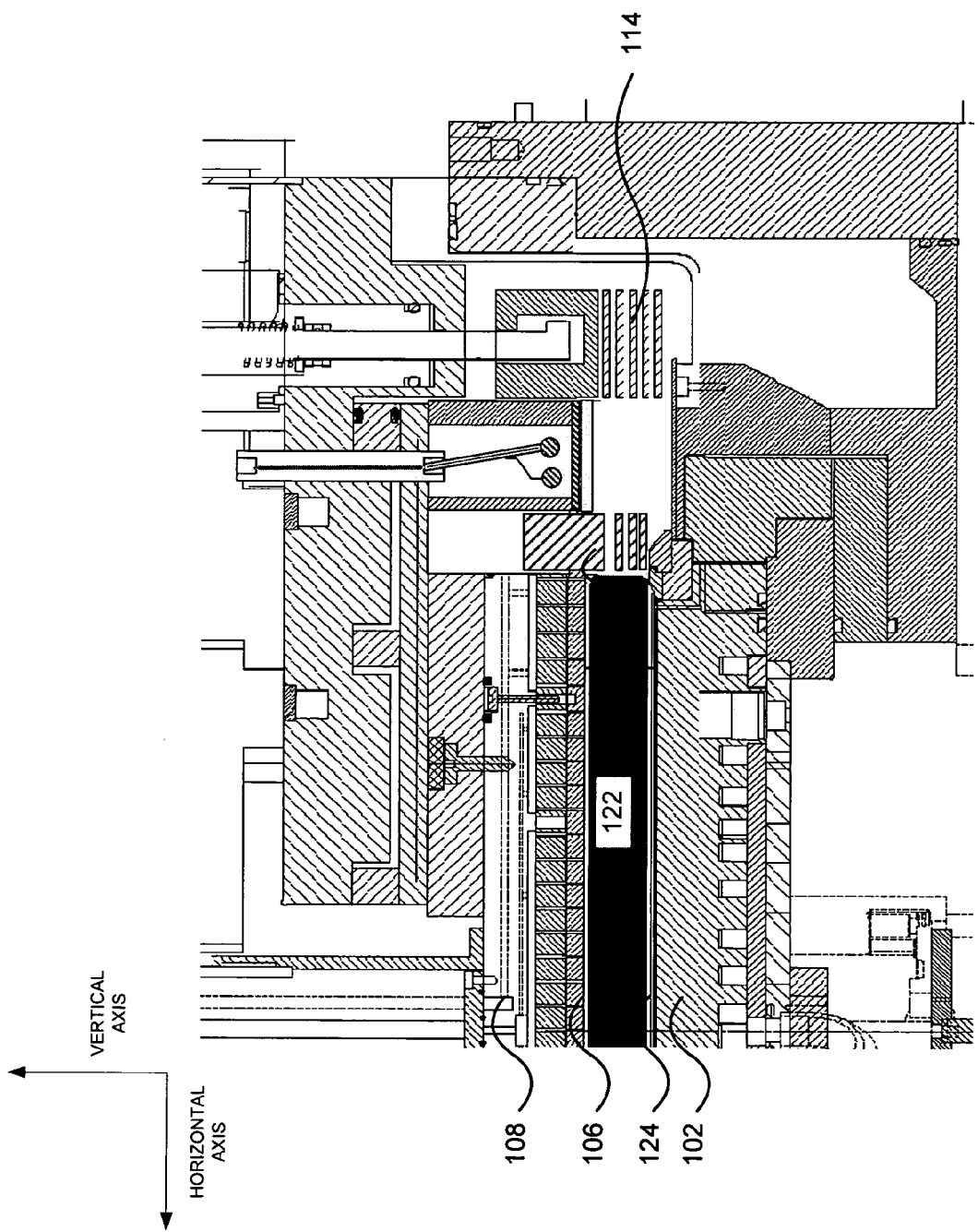
FIG. 3 shows the simplified diagram of a differential plasma processing chamber of FIG. 2, in which a showerhead is pre-coated with a material comprising silicon, according to an embodiment of the invention.

Referring now to FIG. 3, the simplified diagram of a differential plasma processing chamber of FIG. 2 is shown, in which a showerhead is pre-coated with a material comprising silicon, according to an embodiment of the invention. As previously stated, showerhead assembly 106 shields grounded electrode 108 with a protective layer of perforated silicon that allow plasma gases to pass through into the plasma chamber from a gas distribution system [not shown]. In an embodiment, the thickness of the silicon pre-coat layer is about 4.0 μm.

In an advantageous manner, prior to processing a substrate, a substantial portion of the showerhead is pre-coated with a material comprising silicon (e.g., silicon, silicon nitride, silicon carbide, etc.). In an embodiment, the material comprising silicon is amorphous silicon. In general, amorphous silicon may be deposited from silane gas by using an electric discharge. Generally, the deposited amorphous silicon sticks well to the underlying single-crystalline silicon of the shower head because of a fairly close lattice match between the atoms of each layer.

In one method of pre-coating the showerhead, both inner confinement ring set 118 and the outer confinement ring set 114 are lowered. A silicon containing gas is then fed into the differential plasma chamber through showerhead 106 into an area 122 in the plasma chamber. Powered electrode 102 may then be energized, causing a silicon pre-coat to be deposited on the showerhead. Typically, a covering or dummy substrate 124 is placed on powered electrode 102 in order to shield it during the pre-coat process.

Figure 4:
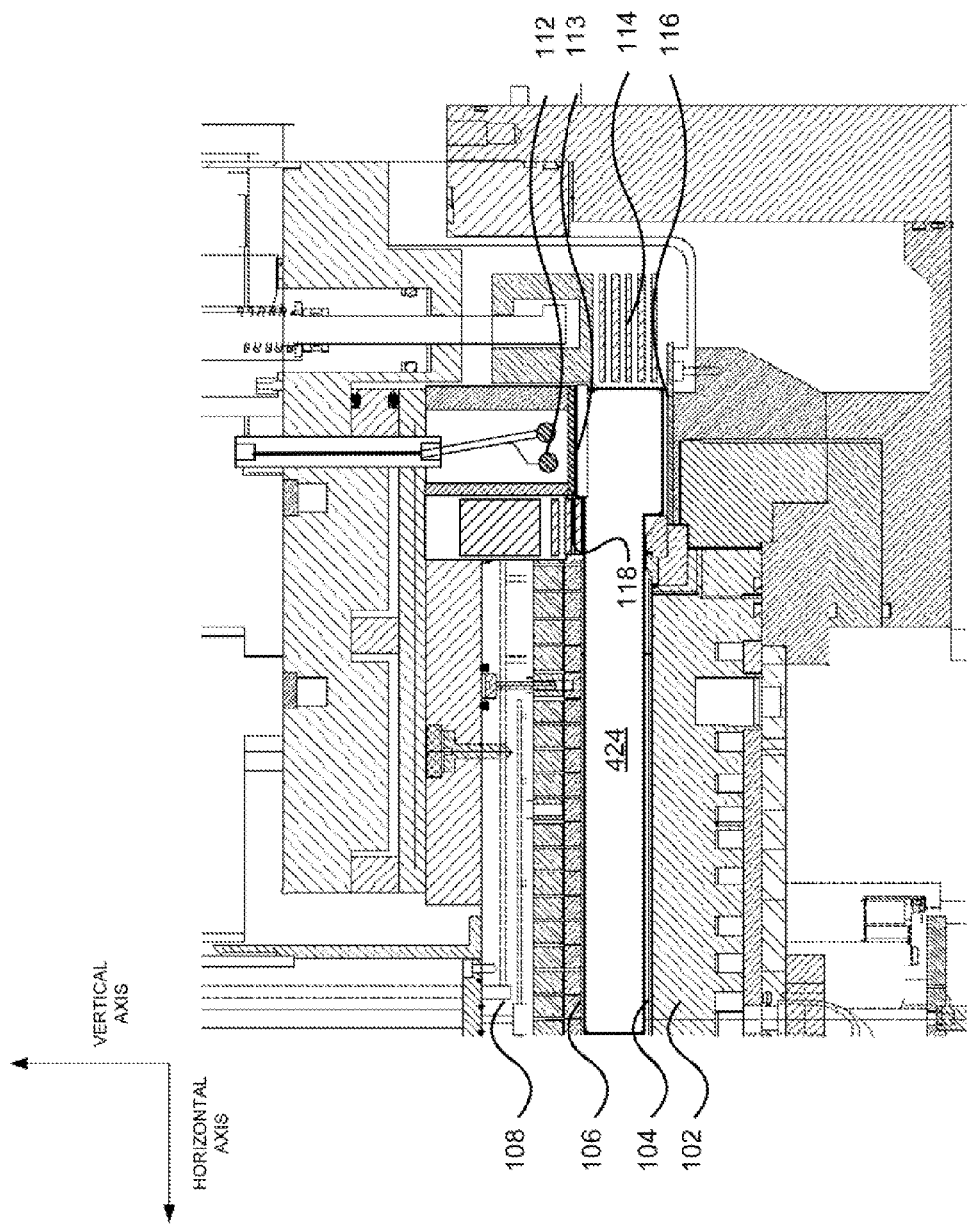
FIG. 4 shows the simplified diagram of a differential plasma processing chamber of FIG. 3, in which a substrate is being etched, according to an embodiment of the invention.

Referring now to FIG. 4, the simplified diagram of a differential plasma processing chamber of FIG. 3, in which a substrate is being etched, according to an embodiment of the invention. For example, in a Lam Research 2300 Exelan Flex plasma processing system, a common etching recipe may be 2000 W (27 MHz)/3000 W (2 MHz), 300 sccm Ar, 20 sccm C4F8, 20 sccm O2, 45 mTorr. As previously stated, a substantial portion of the showerhead 106, quartz window 113, and grounded ring 116 are pre-coated, such that these surfaces are protected during an etch process. In general, inner confinement ring set 118 may be in a raised position in order to allow differential plasma 424 to extend across substrate 104 toward outer confinement ring 114. For example, a substrate may be etched as part of a dual damascene process in which, dielectric layers are electrically connected by a conductive plug filling a via hole.

Figure 5:
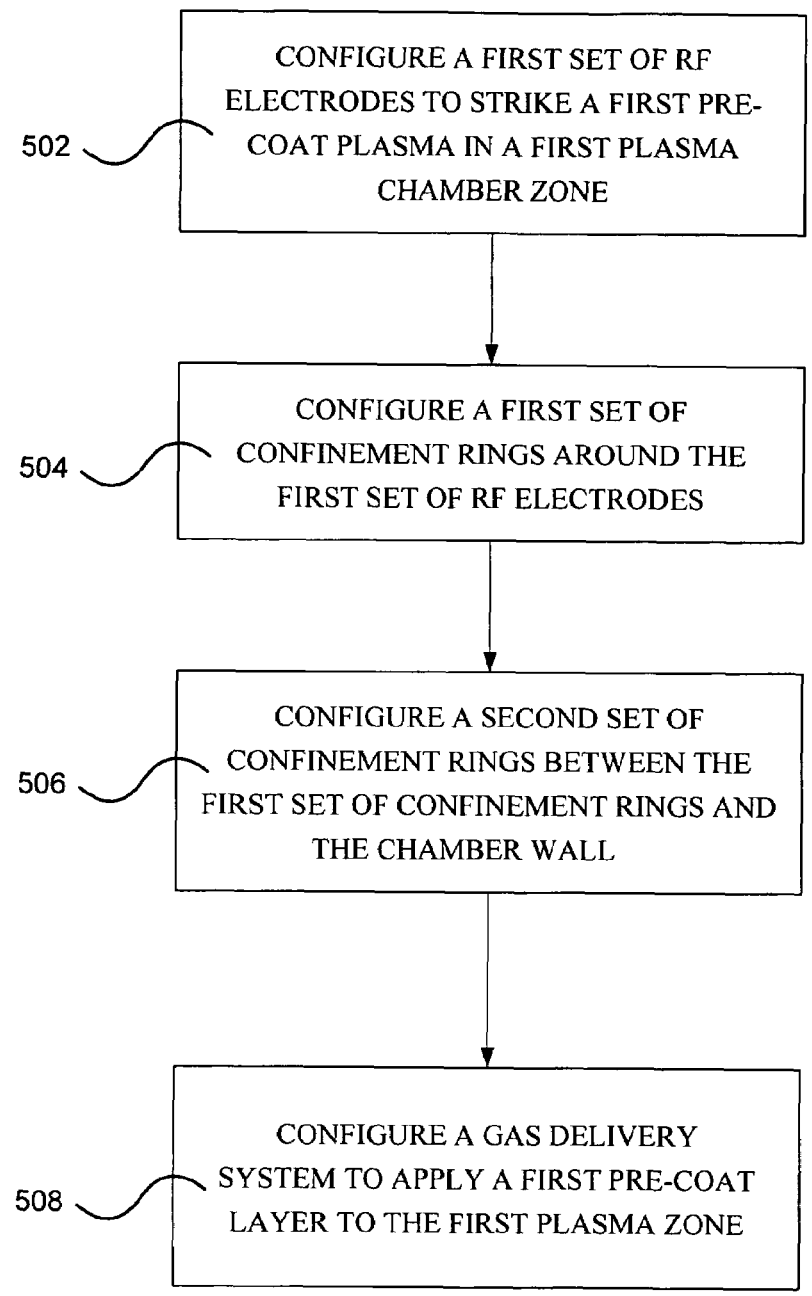
FIG. 5 shows a simplified set of steps for selectively pre-coating a plasma processing chamber, including a chamber wall, according to an embodiment of the invention.

Referring now to FIG. 5, a simplified set of steps is shown for selectively pre-coating a plasma processing chamber, including a chamber wall, according to an embodiment of the invention. Initially, at 502, a first set of RF electrodes is configured to strike a first pre-coat plasma, the first set of RF electrodes defining a first plasma chamber zone. Next at 504, a first set of confinement rings is configured around the first set of RF electrodes. Then at 506, a second set of confinement rings is configured between the first set of confinement rings and the chamber wall.

In an embodiment, a second set of RF electrodes is also configured between the first set of confinement rings and the second set of confinement rings. In an embodiment, a the second set of RF electrodes is configured to strike a second pre-coat plasma, the second set of RF electrodes defining a second plasma chamber zone.

Finally at step 508, a gas delivery system is configured to apply a first pre-coat layer to the first plasma zone when a first pre-coat gas is delivered and the first set of RF electrodes is energized. For example, the first pre-coat gas may include one of silicon, amorphous silicon, silicon nitride, and silicon carbide. In an embodiment, the gas delivery system is configured to apply a second pre-coat layer to the second plasma zone when a second pre-coat gas is delivered, and the second set of RF electrodes is energized. For example, the second pre-coat gas may include a hydrocarbon gas.

In an embodiment, the first set of RF electrodes is capacitively coupled, and the second set of RF electrodes is inductively coupled. In an embodiment, the first set of RF electrodes is inductively coupled, and the second set of RF electrodes is capacitively coupled. In an embodiment, both the first set of RF electrodes and the second set of RF electrodes are capacitively coupled. In an embodiment, both the first set of RF electrodes and the second set of RF electrodes are inductively coupled. In an embodiment, at least one of the first set of confinement rings and the second set of confinement rings is configured to be movable.

While this invention has been described in terms of several preferred embodiments, there are alterations, permutations, and equivalents which fall within the scope of this invention. For example, although the present invention has been described in connection with plasma processing systems from Lam Research Corp. (e.g., Exelan™, Exelan™ HP, Exelan™ HPT, 2300 Exelan Flex™, Versys™ Star, etc.), other plasma processing systems may be used. This invention may also be used with substrates of various diameters (e.g., 200 mm, 300 mm, etc.). Also, photoresist plasma etchants comprising gases other than oxygen may be used. It should also be noted that there are many alternative ways of implementing the methods of the present invention.

Advantages of the invention include methods and apparatus for selective pre-coating of a plasma processing chamber. Addition advantages include protecting surfaces within the plasma chamber, minimizing contamination, simplifying the manufacturing process, and improving substrate yield.

Having disclosed exemplary embodiments and the best mode, modifications and variations may be made to the disclosed embodiments while remaining within the subject and spirit of the invention as defined by the following claims.

What is claimed is:

1. A plasma processing system comprising:
   a first confinement ring set movable to at least a first position and a second position;
   a showerhead assembly for providing gas for the plasma processing system to perform plasma processing, the first confinement ring set surrounding the showerhead assembly when the first confinement ring set is in the second position; and
   a second confinement ring set, the second confinement ring set surrounding the first confinement ring set when the first confinement ring set is in the first position,
   wherein the first confinement ring set is configured to define a first area when the first confinement ring set is in the first position,
   the first area is associated with a first portion of the plasma processing system,
   the first confinement ring set and the second confinement ring set are configured to define a second area between the first confinement ring set and the second confinement ring set when the first confinement ring set is in the first position, and
   the second area is associated with a second portion of the plasma processing system; a set of induction coils to radiate radio frequency energy and a grounded ring to facilitate grounding, wherein the second area is between the set of induction coils and said grounded ring.

2. The plasma processing system of claim 1 wherein the first position is lower than the second position.

3. The plasma processing system of claim 1 wherein the first portion of the plasma processing system includes a first coating, and wherein the second portion of the plasma processing system includes a second coating that is different from the first coating.

4. The plasma processing system of claim 3 wherein the second coating is formed of a hydrocarbon material.

5. The plasma processing system of claim 1 wherein the first confinement ring set and the second confinement ring set are concentric.

6. The plasma processing system of claim 1 wherein at least one of the first portion of the plasma processing system and the second portion of the plasma processing system includes at least one of an electrode, a showerhead, an induction coil, and a grounded ring.

7. The plasma processing system of claim 1 wherein the first portion of the plasma processing system includes at least one of an electrode and a showerhead.

8. The plasma processing system of claim 1 wherein the second portion of the plasma processing system includes at least a grounded ring.

9. The plasma processing system of claim 1 wherein at least one of the first portion of the plasma processing system and the second portion of the plasma processing system includes at least one of a silicon layer, a hydrocarbon layer, a silicon dioxide layer, an amorphous silicon layer, a silicon nitride layer, and a silicon carbide layer.

10. The plasma processing system of claim 1 wherein the first portion of the plasma processing system includes a first coating that includes a silicon layer.

11. The plasma processing system of claim 10 wherein the first coating has a thickness that is greater than or equal to 4.0 µm.

12. The plasma processing system of claim 10 wherein the second portion of the plasma processing system includes a second coating that includes at least one of a hydrocarbon layer and a silicon dioxide layer.

13. The plasma processing system of claim 12 wherein the second coating has a thickness that is greater than or equal to 1.5 µm.

14. The plasma processing system of claim 1 wherein the first portion of the plasma system includes a first coating, the second portion of the plasma processing system includes a second coating, at least one of the first coating and the second coating is bonded to a surface of at least one of the first portion of the plasma processing system and the second portion of the plasma processing system by one or more van der Waals forces.

15. The plasma processing system of claim 1 further comprising a capacitively coupled plasma source and an inductively coupled plasma source.

* * * * *